United States Patent
Huangfu et al.

(10) Patent No.: US 9,570,532 B2
(45) Date of Patent: Feb. 14, 2017

(54) PIXEL STRUCTURE, DISPLAY PANEL AND DISPLAY APPARATUS

(71) Applicant: BOE TECHNOLOGY GROUP CO., LTD., Beijing (CN)

(72) Inventors: Lujiang Huangfu, Beijing (CN); Zhanjie Ma, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 183 days.

(21) Appl. No.: 14/104,485

(22) Filed: Dec. 12, 2013

(65) Prior Publication Data

US 2014/0167011 A1    Jun. 19, 2014

(30) Foreign Application Priority Data

Dec. 13, 2012   (CN) .......................... 2012 1 0539995

(51) Int. Cl.
*H01L 21/00*   (2006.01)
*H01L 27/32*   (2006.01)
*G09G 3/32*    (2016.01)

(52) U.S. Cl.
CPC ......... *H01L 27/3279* (2013.01); *G09G 3/3225* (2013.01); *H01L 27/3204* (2013.01); *H01L 27/3218* (2013.01); *G09G 2300/0452* (2013.01); *G09G 2300/08* (2013.01); *G09G 2330/021* (2013.01); *H01L 27/3244* (2013.01)

(58) Field of Classification Search
CPC ............. H01L 27/3279; H01L 27/3204; H01L 27/3218; H01L 51/0002; H01L 51/56; H01L 51/5012
See application file for complete search history.

(56) References Cited

U.S. PATENT DOCUMENTS 7,129,914 B2 * 10/2006 Knapp ................. G09G 3/3233
                                                                345/36
7,888,864 B2    2/2011 Young
2007/0216610 A1 * 9/2007 Smith ................. H01L 27/3204
                                                                345/76
2010/0277403 A1  11/2010 Chao et al.

FOREIGN PATENT DOCUMENTS

CN          1605093 A      4/2005
CN          1711640 A     12/2005
(Continued)

OTHER PUBLICATIONS

Chinese Office Action Dated Jan. 13, 2014, Application No. 201210539995.X, 6 Pages.
(Continued)

*Primary Examiner* — Laura Menz
(74) *Attorney, Agent, or Firm* — Brooks Kushman P.C.

(57) ABSTRACT

The embodiment of the present invention provides a pixel structure, pixel unit structure, display panel and display apparatus, which is used to increase the electrical-optical efficiency of the display apparatus. The pixel structure includes an active matrix driving circuit, also includes at least two light emitting devices connected in series which are connected to the active matrix driving circuit, the light emitting devices compose the light emitting device group, and the active matrix driving circuit drives the light emitting devices to emit light.

11 Claims, 7 Drawing Sheets

(56) References Cited

FOREIGN PATENT DOCUMENTS

| CN | 202948702 U | 5/2013 |
|---|---|---|
| JP | 2000089691 A | 3/2000 |
| JP | 2007520039 A | 7/2007 |
| KR | 20120062789 A | 6/2012 |
| WO | 2004044987 A2 | 5/2004 |
| WO | 2005074327 A1 | 8/2005 |
| WO | 2011022144 A1 | 2/2011 |

OTHER PUBLICATIONS

Extended European Search Report Dated Feb. 17, 2014, Applicant Boe Technology Group Co., Ltd., Application No. 13197099.8-1904, 8 Pages.
Chinese Decision of Rejection Action Dated Jul. 30, 2015, Application No. 201210539995.X, 5 Pages.
Korean Notice of Final Rejection Dated Jul. 27, 2015, Application No. 10-2013-0154709, Applicant BOE Technology Group Co, Ltd., 3 pages.
Chinese Second Office Action Dated Jul. 30, 2014, Application No. 201210539995.X, 6 Pages.
Chinese Third Office Action Dated Jan. 12, 2015, Application No. 201210539995.X, 4 Pages.
Korean Office Action Dated Jan. 5, 2015, Application No. 10-2013-0154709, Applicant BOE Technology Group Co, Ltd., 5 Pages.
Chinese Office Action for Chinese Application No. 20121053995X, English translation attached to original, Dated Apr. 19, 2016, All together 10 Pages.

* cited by examiner

PIXEL STRUCTURE, DISPLAY PANEL AND DISPLAY APPARATUS

CROSS-REFERENCE TO RELATED APPLICATIONS

This application claims priority to Chinese application No. 201210539995.X, filed Dec. 13, 2012 which is hereby incorporated by reference in its entirety.

TECHNICAL FIELD

The present invention relates to the technical field of organic light emitting, especially relates to a pixel structure, pixel unit structure, display panel and display apparatus.

BACKGROUND

An organic light emitting display is called a new generation of fantastic display because of its many advantages, such as all-solid-state, active emission, high contrast, ultra thin, low power consumption, wide visual angle, fast response speed, wide operation ranges, easy to realize the flexible display and 3D display. Meanwhile, because the light emitting device has a characteristic of capable of forming a large area of film, which can be used for an ideal large size of a flat panel display apparatus. Currently, the light emitting device widely used is an organic light emitting diode (Organic Light Emitting Diode, OLED). A large size organic light emitting display apparatus made by the OLED, such as the OLED color TV, the OLED flat panel computer, becomes the pursuit of many manufactories currently.

A light emitting device needs a certain driving current to emit light, this driving current is usually provided by a peripheral circuit, for example, a reference voltage source provides a certain voltage $V_{DD}$ to the light emitting device via an active matrix driving circuit of the organic light emitting display panel. As the size of the organic light emitting display apparatus increases, the amount of wiring of the active matrix driving circuit increases, which causes the wiring resistance also increasing, thus a voltage drop generated by the wiring resistance (IR Drop) increases. But IR Drop does not contribute to the light emitting of the light emitting device, instead, it becomes heat power consumption to dissipate, not only reducing the electrical-optical efficiency of the display device, increasing the power consumption, but also affecting the display effect of the display apparatus due to the performance of the light emitting martial of the electrical element will be influenced if the heat in the circuit achieves a certain level.

In the color display technical field, a pixel unit includes three pixels of red pixel, green pixel, and blue pixel. In the existing mainstream technology, in order to simplify the circuit, a light emitting device of the red, green, or blue pixel in a pixel unit is driven by a single voltage source $V_{DD}$-$V_{SS}$ to emit light. However, due to the preset working voltage of the light emitting device of different color is usually different, for example, the working voltage of the blue light emitting device is higher, and the working voltage of the red and the green light emitting device is lower, which causes the fact that if the supply voltage $V_{DD}$-$V_{SS}$ applied to the active matrix driving circuit is the same, in order to ensure realizing the white balance display, the matrix driving supply voltage $V_{DD}$-$V_{SS}$ must be set according to the working voltage of the blue light emitting device. In the case that the blue light emitting device can work normally, due to the preset working voltage of the red and the green light emitting device is lower, in order to make all of the light emitting devices of three colors work normally and form the white balance display according to a proper proportion of strength, the driving transistors set in the active matrix driving circuit needs to substantially share the voltage beyond the range of the preset working voltage of the device. However, for the blue light pixel, the driving transistors in the red and green active matrix driving circuits sharing the excesses voltage and the corresponding power consumption, which does not contribute to the light emitting of the light emitting device, but becomes the heat power consumption to dissipate, which not only reducing the electrical-optical efficiency of the display device, but also affecting the working performance of the light emitting martial of the electronic components due to the heat in the circuit achieves a certain degree, thereby affecting the display effect of the display apparatus.

SUMMARY

The embodiment of the present invention provides a pixel structure, an organic light emitting display panel and a display apparatus, which are used to reduce the voltage drop generated by the wiring resistance in the pixel structure, reduce the energy loss caused by heat power consumption, and increase the electrical-optical efficiency of the display apparatus.

The pixel structure according to the embodiment of the present invention including: an active matrix driving circuit, and also including at least two light emitting devices connected in series which are connected to the active matrix driving circuit, the light emitting devices compose a light emitting device group, and the active matrix driving circuit drives the light emitting devices to emit light.

Preferably, all the light emitting devices connected in series are red light emitting devices, or all the light emitting devices connected in series are green light emitting devices, or all the light emitting devices connected in series are blue light emitting devices.

Preferably, the light emitting device is an organic light emitting diode.

Preferably, light emitting areas of the light emitting devices connected in series are the same.

Preferably, the active matrix driving circuit including a first end and a second end, the first end is coupled to a first reference voltage source, the second end is coupled to a second reference voltage source, the light emitting devices connected in series are disposed on the first end or the second end of the active matrix driving circuit; or on the first end and the second end of the active matrix driving circuit separately.

Preferably, for the light emitting devices connected in series which are disposed on the first end and/or the second end of the active matrix driving circuit, if there are more than one of the light emitting devices disposed on the first end or the second end, an anode of one light emitting device is electrically connected to a cathode of an adjacent light emitting device.

Preferably, if there are more than one of the light emitting devices disposed on the first end or the second end, the light emitting devices connected in series including:

A substrate; a first anode and a second anode arranged in a same layer on the substrate; a first organic light emitting layer and a second organic light emitting layer arranged in a same layer on the first anode and the second anode separately; a first cathode and a second cathode arranged in a same layer on the first organic light emitting layer and the second organic light emitting layer separately; or The light emitting devices connected in series including: a substrate; a first cathode and a second cathode arranged in a same layer on the substrate; a first organic light emitting layer and a second organic light emitting layer arranged in a same layer on the first cathode and the second cathode separately; a first anode and a second anode arranged in a same layer of the first organic light emitting layer and the second organic light emitting layer separately;

The first anode and the second cathode are electrically connected.

A pixel unit structure according to the embodiment of the present invention, including three pixel structures of a red pixel structure, a green pixel structure, and a blue pixel structure, at least one of the three pixel structures is the pixel structure described above.

A display panel according to the embodiment of the present invention, includes the said pixel unit structure.

Preferably, for each pixel unit structure, the number of the red light emitting devices is different from the number of the green light emitting devices and/or the number of the red light emitting devices is different from the number of the blue light emitting devices, and/or the number of the green light emitting devices is different from the number of the blue light emitting devices.

Preferably, the number of the red light emitting devices is larger than the number of the blue light emitting devices, the number of the green light emitting devices is larger than the number of the blue light emitting devices.

Preferably, in each pixel unit structure, the number of the red light emitting devices is 2-5, the number of the green light emitting devices is 2-6, the number of the blue light emitting devices is 1-3.

A display apparatus provided in the embodiment of the present invention including the display panel described above.

The pixel structure provided by the embodiment of the present invention includes the light emitting device group, each of the light emitting device group includes at least two light emitting devices, by using more light emitting devices to share the voltage, in the case that the power driving the light emitting devices to emit light is invariant, the driving current that drives the light emitting device to emit light is reduced, and the useless heat power consumption of the wiring voltage drop in the pixel structure is reduced. For example, the light emitting device group is composed of n light emitting devices, the driving current is reduced to 1/n of the current required by the existing active matrix driving circuit, the wiring voltage drop in the active matrix driving circuit is reduced, the heat power consumption caused by the wiring voltage drop is $1/n^2$ of the power consumption caused by the existing wiring voltage drop. It is possible to greatly reduce the useless heat power consumption brought by the wiring voltage drop, increase the electrical-optical efficiency of the display apparatus.

The present invention will be more clearly understood from the description of preferred embodiments as set forth below, with reference to the accompanying drawings.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

The embodiment of the present invention provides a pixel structure, an organic light emitting display panel and a display apparatus, which are used to reduce the voltage drop generated by the wiring resistance of the active matrix driving circuit in the pixel structure, reduce the energy loss caused by heat power consumption, and increase the electrical-optical efficiency of the display apparatus.

Next, the technical solutions disclosed by the embodiment of the present application are described in details with reference to the figures.

Figure 1:
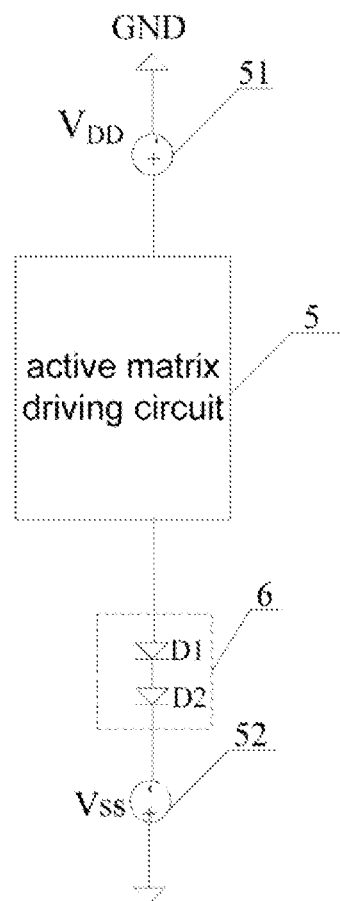
FIG. 1 is a schematic diagram of the pixel structure according to embodiment of the present invention.

Referring to FIG. 1, the pixel structure according to embodiment of the present invention includes:

An active matrix driving circuit 5;

A light emitting device group 6 which is connected to the active matrix driving circuit 5; the light emitting device group 6 includes at least two light emitting devices connected in series, such as the light emitting device D1 and the light emitting device D2 in FIG. 1.

The light emitting device group 6 is not limited to including two light emitting devices connected in series, the light emitting device group 6 can also include three or even more light emitting devices, which can be connected in series.

The active matrix driving circuit 5 is coupled to a first reference voltage source 51 of a peripheral circuit, which provides a driving current (a corresponding voltage can be $V_{DD}$) to the active matrix driving circuit 5; one end of the light emitting device is connected to the active matrix driving circuit 5, the other end is connected to a second reference voltage source 52 (a corresponding voltage can be $V_{SS}$).

The pixel structure shown in FIG. 1 can be a pixel structure corresponding to a red pixel, a green pixel, or a blue pixel. Also, the pixel structure can include pixel structures corresponding to other colors, such as a pixel structure corresponding to a yellow pixel, etc., in the following, only the pixel structure corresponding to the red pixel, the green pixel or the blue pixel will be described as an example.

When the light emitting device group in the pixel structure is a red light emitting device group (i.e. the light emitting device group is composed of the light emitting devices which emit red light), the light emitting device group is corresponding to a red pixel; similarly, when the light emitting device group in the pixel structure is a green light emitting device group, the light emitting device is corresponding to a green pixel; when the light emitting device group in the pixel structure is a blue light emitting device group, the light emitting device group is corresponding to a blue pixel.

In other word, the light emitting devices connected in series are red light emitting devices, green light emitting devices or blue light emitting devices.

Preferably, the light emitting device according to embodiment of the present invention can be an organic light emitting diode (OLED) or other organic light emitting device (EL).

Preferably, the light emitting areas of the light emitting devices connected in series are the same.

In the pixel structure shown in FIG. 1, once the structure of the light emitting device is determined, the working voltage of the light emitting device is determined, the driving power of the light emitting device for normal work is only related to the driving current flowing through the light emitting device. In the embodiment of the present invention, at least two light emitting devices connected in series are set in each pixel structure, under the premise of ensuring the driving power is invariant, it needs to reduce driving current I, for n light emitting devices connected in series, the needed driving current is (1/n)I. At this point, in the case the wiring resistance of the active matrix driving circuit is certain, the wiring heat power consumption is reduced to $1/n^2$ of the original one, thereby the electrical-optical efficiency of the display apparatus is increased.

Figure 2:
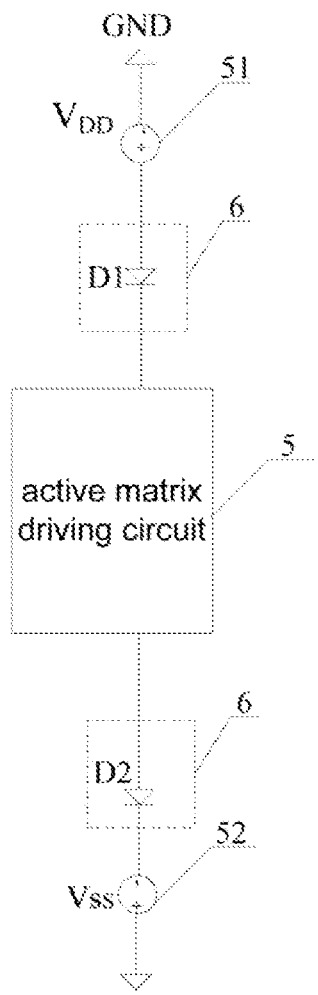
FIG. 2 is one of the structure schematic diagrams showing the organic light emitting display panel according to embodiment of the present invention, the organic light emitting display panel contains the active matrix driving circuit shown in FIG. 1.

The light emitting devices connected in series can be arranged adjacently as shown in FIG. 1, also can be arranged not adjacently as shown FIG. 2. Specifically, the active matrix driving circuit 5 includes two ends, i.e., a first end and a second end, the first end is coupled to the first reference voltage source 51, the second end is coupled to the second reference voltage source 52, the light emitting devices connected in series can be disposed on the same end (the first end or the second end) of the active matrix driving circuit 5, also can be disposed on the different ends (partial light emitting devices are disposed on the first end, other partial light emitting devices are disposed on the second end) of the active matrix driving circuit 5 separately.

Figure 3:
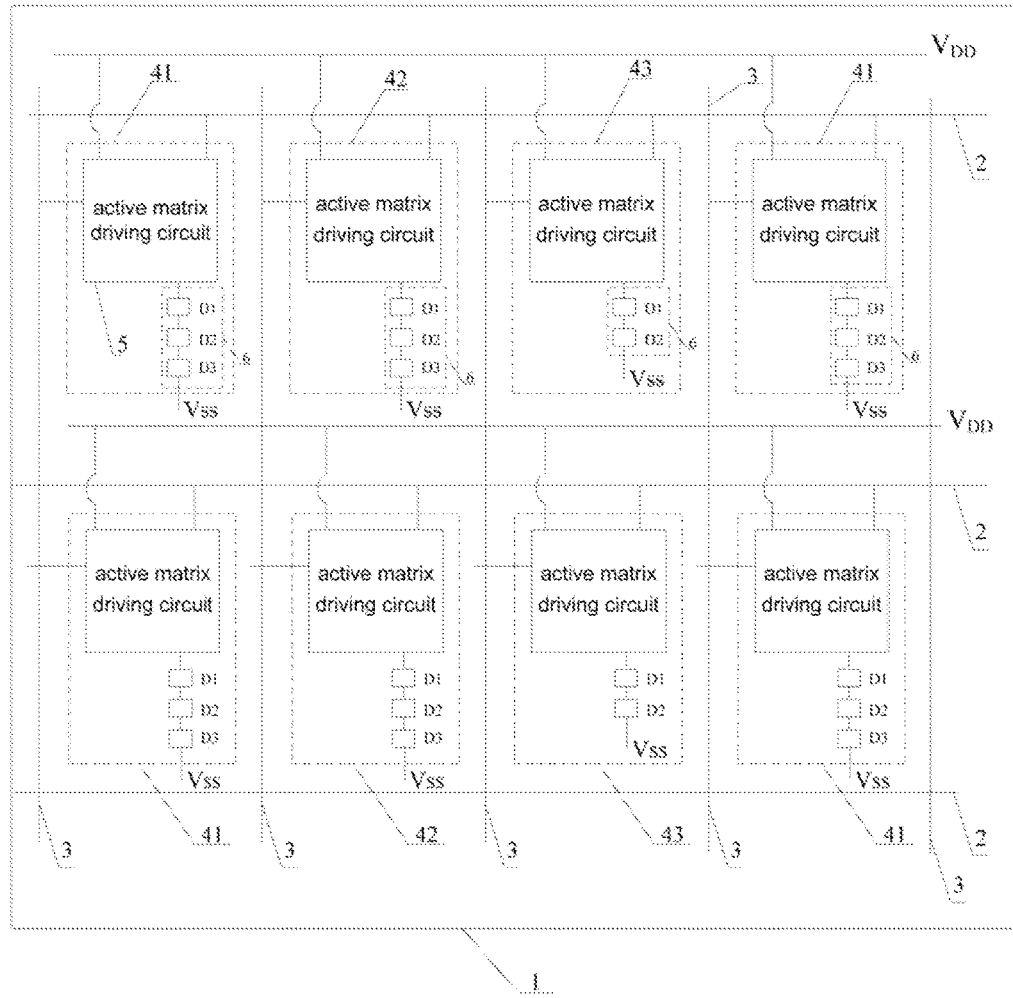
FIG. 3 is another schematic diagram showing the organic light emitting display panel according to embodiment of the present invention, the organic light emitting display panel contains the active matrix driving circuit shown in FIG. 1.

Referring to FIG. 3, the display panel according to the embodiment of the present invention includes pixel unit structures, each pixel unit structure includes pixel structures arranged as array;

Specifically, the organic light emitting display panel includes:

A substrate 1, multiple grid scan lines 2 arranged along a first direction on the substrate 1, multiple data signal lines 3 arranged along a second direction vertical to the first direction, and the pixel unit structures surrounded by the grid scan lines 2 and data signal lines 3.

Each pixel unit structure can include a red pixel 41, a green pixel 42, and a blue pixel 43;

Each pixel unit structure (red pixel 41, green pixel 42, and blue pixel 43) includes the active matrix driving circuits 5 and the light emitting device groups 6; the light emitting device groups 6 are connected to the active matrix driving circuits 5; the grid scan lines 2 and the data signal lines 3 are connected to the active matrix driving circuits 5.

The Light emitting device group 6 can include at least two light emitting devices connected in series, such as the light emitting device D1 and the light emitting device D2 which are connected in series, or the light emitting device D1, the light emitting device D2 and the light emitting device D3 which are connected in series, as shown in FIG. 3.

The peripheral circuit provides a reference voltage VDD to the active matrix driving circuits, and the peripheral circuit provides a reference voltage VSS to the light emitting devices.

The light emitting devices emit light under the operation of the driving current.

Next, the principle that the organic light emitting display panel provided by the embodiment of the present invention can reduce wiring voltage drop, reduce the energy loss caused by heat power consumption, and increase the electrical-optical efficiency of the display apparatus will be described in details.

The current section and the driving current of the light emitting device will decide the luminous quantity of the light emitting device. Compared with setting one light emitting device in each pixel structure, under the premise of achieving the same luminous quantity, that is under the premise of the driving power being the same, the embodiment of the present invention sets at least two light emitting devices connected in series in each pixel structure, taking setting two light emitting devices connected in series for example, the light emitting area of each light emitting device becomes at least ½ of the original one, correspondingly, the current section of each light emitting device becomes at least ½ of the original one, due to the light emitting devices in the light emitting device group are connected in series, that is, the driving power for each light emitting device is P=UI, wherein, U is the working voltage of each light emitting device, I is the current flowing through the light emitting device. As mentioned above, each light emitting device group can include three or even more light emitting devices. It is assumed here that the light emitting device group includes n light emitting devices, wherein, n≥2, the total light emitting power of the light emitting device group $P_{total}$=nUI. Due to the working voltage U of the light emitting device is decided by the light emitting material and structure that compose the light emitting device, the working voltages of the light emitting devices with different light emitting areas are the same. Therefore, when the current flowing through the light emitting device is 1/n of the original one (the current flowing through the light emitting device in the case of one light emitting device is set), the driving power maintains invariant. The wiring resistance is determined, the heat power consumption on the wiring resistance $P_{wiring}=I^2R$ reduces to $1/n^2$ of the original one. That is the embodiment of the present invention only needs to apply a smaller driving current (corresponding to the first reference voltage $V_{DD}$ that is smaller) to realize the purpose of maintaining the same drive power. Besides, it reduces the useless heat power consumption of the wiring resistance, increases the electrical-optical efficiency of the display device.

Preferably, Referring to FIG. 3, the red pixel 41 includes the red light emitting device group 6 which is composed by a red light emitting device D1, a red light emitting device D2 and a red light emitting device D3 connected in series; the green pixel 42 includes the green light emitting device group 6, which is composed by a green light emitting device D1, a green light emitting device D2 and a green light emitting device D3 connected in series; the blue pixel 43 includes the blue light emitting device group 6, which is composed by a blue light emitting device D1 and a blue light emitting device D2 connected in series.

Wherein, in the light emitting device group of each pixel unit structure (including a red pixel 41, a green pixel 42 and a blue pixel 43), the number of the red light emitting devices is larger than the number of the blue light emitting devices; the number of the green light emitting devices is larger than the number of the blue light emitting devices. Setting in a such method can not only reduce the useless heat power consumption of the wiring resistance, increase the electrical-optical efficiency of the display devices, but also set appropriate number of the light emitting devices in different pixel structures in each pixel unit structure, makes the working voltages of the light emitting device groups are as close as possible, therefore to fully utilize the supply voltage.

This is because the working voltage of the light emitting device such as the organic light emitting diode OLED is decided by the light emitting material and structure that compose the light emitting device, the working voltages of OLEDs with different light emitting areas are the same or approximately the same; therefore, in order to ensure the red OLED, the green OLED, and the blue OLED work with a preset working voltage, the existing mainstream technology sharing a partial of the voltage via the driving transistors set in the active matrix driving circuit, so that the red OLED, the green OLED, and the blue OLED work with the preset working voltage. However the driving transistor will release its voltage drop by the means of heat.

The pixels of three different colors in each pixel unit structure provide a voltage to drive the OLED to emit light by the same first reference voltage source. That is, adopting a single voltage source, it provides the voltage to the pixels of three different colors in each pixel unit structure. By making different numbers of the OLED being connected in series, it can make the working voltages of the light emitting device groups in different pixel structures as close as possible, in this way, the voltages consumed by the pixel drive circuits of different colors can be maintained at a lower level, so as to reduce the useless power consumption.

Specifically, due to the working voltages of the light emitting devices of different colors are different, in the present light emitting devices, the working voltage of the blue light emitting device is higher than the working voltage of the green light emitting device and the red light emitting device. When the reference voltage $V_{DD}$ is applied to the active matrix driving circuit connected to the red light emitting device, green light emitting device and blue light emitting device simultaneously, in order to make the voltage drops applied to the red light emitting device group, the green light emitting device group, and the blue light emitting device group equal or similar, the driving transistors do not need to share the voltages, on the contrary, the driving current of the light emitting device can be reduced by setting an appropriate number of the red light emitting devices, the green light emitting devices and the blue light emitting devices in proportion, thereby to reduce the useless heat power consumption brought by the driving transistors sharing the excessive voltage in case the working voltage mismatches with the voltage $V_{DD}$ provided by the first reference voltage source.

Preferably, in each pixel unit structure, the number of the red light emitting devices is 2-5, the number of the green light emitting devices is 2-6, the number of the blue light emitting devices is 1-3. In view of that the material and element structure of the light emitting device cause a large difference in the device working voltage, the number of the OLED that can be connected in series is not restricted to the above situations.

Preferably, in each pixel unit structure, the light emitting area of each red light emitting device is the same, the light emitting area of each green light emitting device is the same, and the light emitting area of each blue light emitting device is the same.

It should be noted that in the embodiment of the present application, the light emitting areas which are the same is not referring to the areas are absolute the same, a skilled in the art should understand that this is referring to approximately the same or the same within the range of fabrication error.

The light emitting device group according to the embodiment of the present invention can be multiple independent light emitting devices being connected via the wires, or multiple light emitting devices being interconnected.

Figure 4:
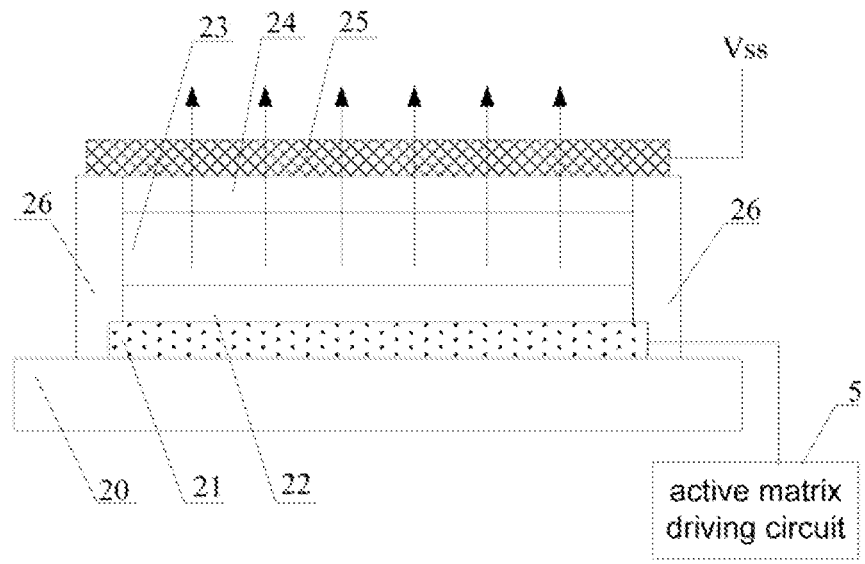
FIG. 4 is a structure schematic of an existing OLED.

Referring to FIG. 4, which is the structure schematic diagram of an OLED.

The OLED includes: a substrate 20, an anode 21, a hole transporting layer 22, an organic light emitting layer 23, an electron transporting layer 24, a cathode 25. The anode 21 is connected to the active matrix driving circuit 5, the cathode 25 is connected to the reference voltage source Vss. The anode 21 and the cathode 25 are isolated by the insulating layer 26.

The OLED is referring to the phenomenon that the organic semiconductor light emitting material emitting light. Wherein, driven by the active matrix driving circuit, the holes and the electrons passing through the anode 21 and the cathode 25 are injected to the organic light emitting layer 23, and the electrons and the holes in the organic light emitting layer 23 are recombinated to emit light.

Specifically, for example, metallic oxides such as Indium Tin Oxides (ITO) transparent electrodes, and metal electrodes such as silver Ag are functioned as the anode 21 and cathode 25 of OLED separately, while they are driven by a certain voltage, the electrons at the cathode 25 and the holes at the anode 21 are injected to the electron transporting layer 24 and the hole transporting layer 22 from the cathode 25 and the anode 21 separately. The electrons and the holes are transferred to the organic luminescent layer 23 via the electron transporting layer 24 and the hole transporting layer 24 separately, and the electrons encounter the holes in the organic luminescent layer 23 to form excitons, the excitons send out energy during the depolarization, which makes the luminescent molecules of the organic luminescent layer to be excited, the luminescent molecules that have been excited return to the original state by radiative relaxation, and send out energy, the energy is launched to the luminous surface (the area of the luminous surface can approximately equal to that of current section of the OLED) of the OLED in the form of visible light, for example, in FIG. 4, the direction indicated by arrows is the outgoing direction of the light.

Connecting OLEDs in series is to electrically connect the anode of one OLED to the cathode of another OLED.

Specifically, using the structures of two adjacent OLEDs to illustrate.

The OLEDs connected in series include:

A substrate; a first anode and a second anode arranged in a same layer on the substrate; a first organic luminescent layer and a second organic luminescent layer arranged in a same layer on the first anode and the second anode separately; a first cathode and a second cathode arranged in a same layer on the first organic luminescent layer and the second organic luminescent layer separately; or The OLEDs connected in series include a substrate: a first cathode and a second cathode arranged in a same layer on the substrate; a first organic luminescent layer and a second organic luminescent layer arranged in a same layer on the first cathode and the second cathode separately; a first anode and a second anode arranged in a same layer on the first organic luminescent layer and the second organic luminescent layer separately;

The first anode and the second cathode are electrically connected.

Aforesaid two adjacent OLEDs are just illustrated with the example of simplest OLEDs of three tiers, nothing but to illustrate the structure of the adjacent OLEDs that are connected in series, the OLED can be any existing structure. However, the structure of the OLEDs connected in series in the embodiment of the present invention would preferably.

Figure 5:
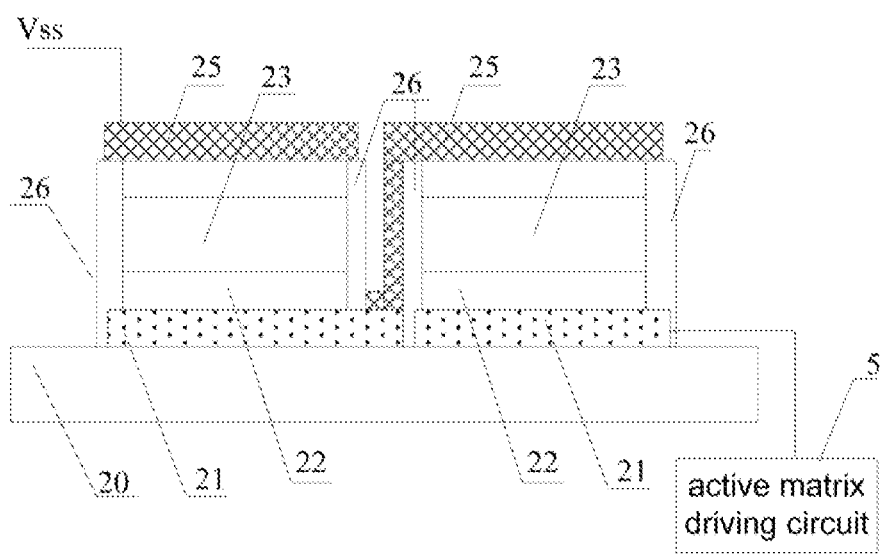
FIG. 5 is a structure schematic of two OLEDs connected in series according to embodiment of the present invention.

Referring to FIG. 5, which is a structural representation of two OLEDs connected in series according to the embodiment of the present invention.

The first OLED (the OLED on the left side in FIG. 5) is connected to the second OLED (the OLED on the right in FIG. 5) via the anode 21 of the first OLED and the cathode 25 of the second OLED. The cathode 25 of the first OLED is connected to the voltage source that provides Vss, the anode 21 of the second OLED is connected to the active matrix driving circuit 5. The size of the structure of the OLED shown in FIG. 5 is as half as the size of the OLED shown in FIG. 4, correspondingly, the current section of the OLED shown in FIG. 5 is as half as the current section of the OLED shown in FIG. 4.

The OLED is either of a bottom emission OLED or a top emission OLED. Wherein, top emission OLED is referring to an OLED that emits light from the top layer, that is, the light is emitted from the sealing layer of the OLED display; a bottom emission OLED is referring an OLED that emits light from the bottom layer, that is, the light is emitted from the back panel of the OLED display.

Next, taking the top emission OLED as an example, the manufacturing process of the OLEDs (the first OLED and the second OLED) connected in series will be illustrated, as shown in FIG. 5, according to the present invention, the process includes the following steps.

Figure 6:
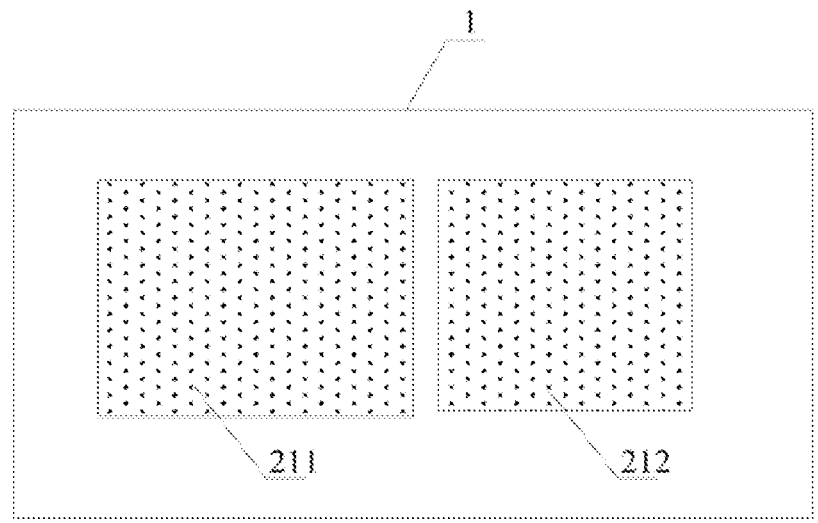
FIG. 6 is an overlooking schematic diagram of the OLED according to embodiment of the present invention, wherein, an anode is formed on the substrate.

1. Depositing a layer of metallic oxide film layer with a certain thickness on the substrate by thermal evaporation method to form two OLED anode patterns with different sizes by masking, exposing, photoengraving sculpture processes. The metallic oxide film layer can be an Indium Tin Oxide ITO film layer or an Indium Zinc Oxide IZO film layer. The two anodes are called the first anode and the second anode separately. There is a gap formed between the first anode and the second anode. The first anode is connected to the cathode of the second OLED; the area of the first anode is larger than the area of the organic luminescent layer of the first OLED, so as to ensure the first anode is interconnected to the cathode of the second OLED later. The planform of the substrate 1 with the first anode 211 and the second anode 212 formed thereon is shown in FIG. 6.

Figure 7:
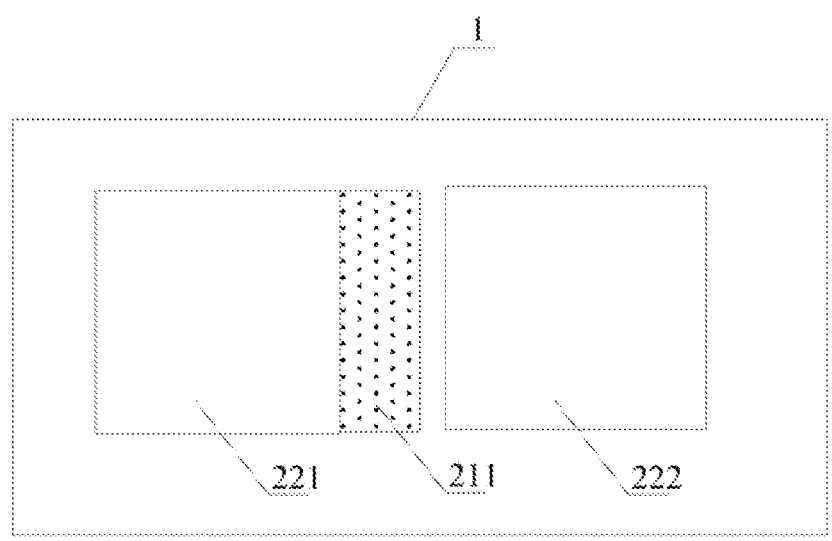
FIG. 7 is an overlooking schematic diagram of the OLED according to embodiment of the present invention, wherein, a hole transporting layer is formed on the substrate.

2. Depositing a layer of conductive film layer with a certain thickness on the substrate by thermal evaporation method, on which, the first anode 211 and second anode 212 have been formed, so as to form two OLED hole transporting layers with the same size by masking, exposing, and photoengraving sculpture processes. The hole transporting layer on the first anode 211 is the first hole transport layer 221, the hole transporting layer on the second anode 212 is the second hole transport layer 222. Partial of electrode zone of the first anode 211 is exposed, so as to interconnect with the cathode of another OLED in the following technological processes. The planform of the substrate 1 with the first hole transporting layer 221 and the second hole transporting layer 222 formed thereon is shown in FIG. 7.

Figure 8:
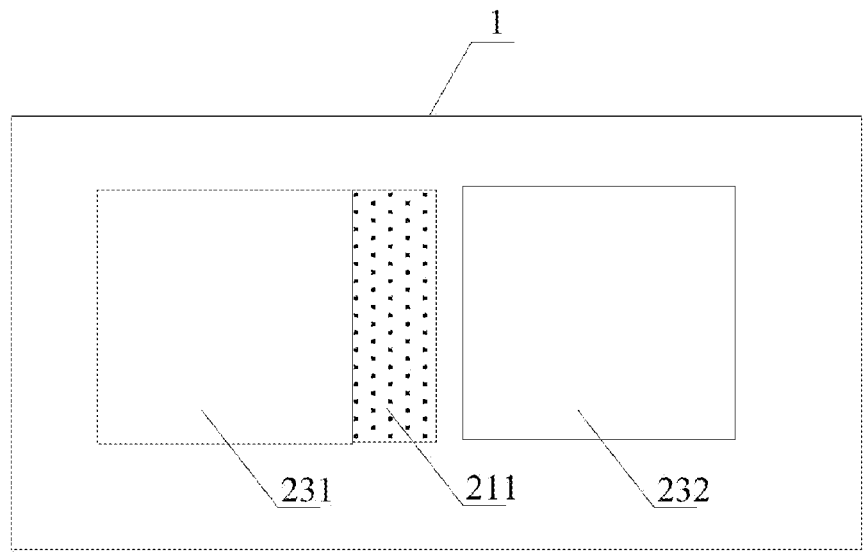
FIG. 8 is an overlooking schematic diagram of the OLED according to embodiment of the present invention, wherein, an organic light emitting layer is formed on the substrate.

3. Depositing a layer of light emitting material film layer on the substrate by thermal evaporation method, on which, the first hole transporting layer 221 and the second hole transporting layer 222 have been formed. Forming two OLED organic luminescent layers with the same size through masking, exposing, photoengraving sculpture processes, which are the first organic luminescent layer 231 and the second organic luminescent layer 232 separately. The planform of the substrate 1 with the first organic luminescent layer 231 and the second organic luminescent layer 232 formed thereon is shown in FIG. 8.

Figure 9:
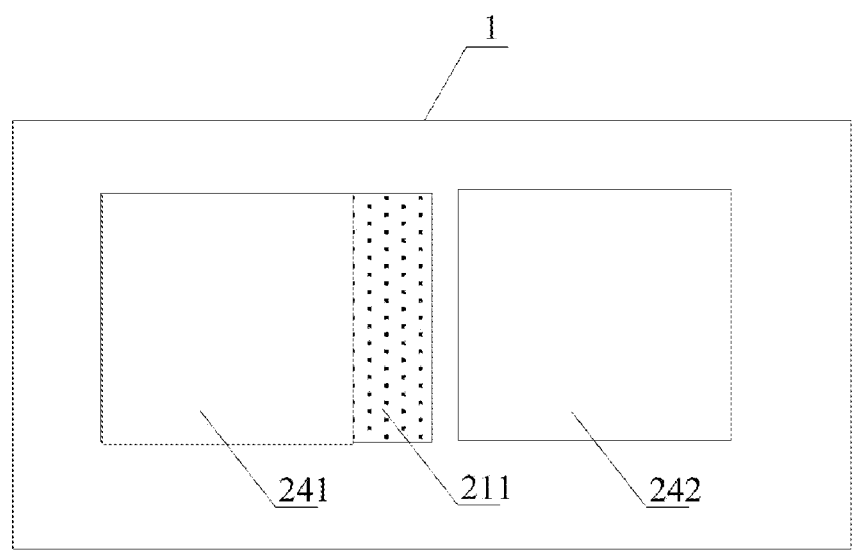
FIG. 9 is an overlooking schematic diagram of the OLED according to embodiment of the present invention, wherein, an electron transporting layer is formed on the substrate.

4. A electron transporting layer is formed on the substrate 1 by thermal evaporation method, on which, the first organic luminescent layer 231 and the second organic luminescent layer 232 have been formed, the forming process is similar to that of the hole transporting layer, with the only difference in material. Formed first electron transporting layer 241 and the second electron transporting layer 242 are shown in FIG. 9.

Figure 10:
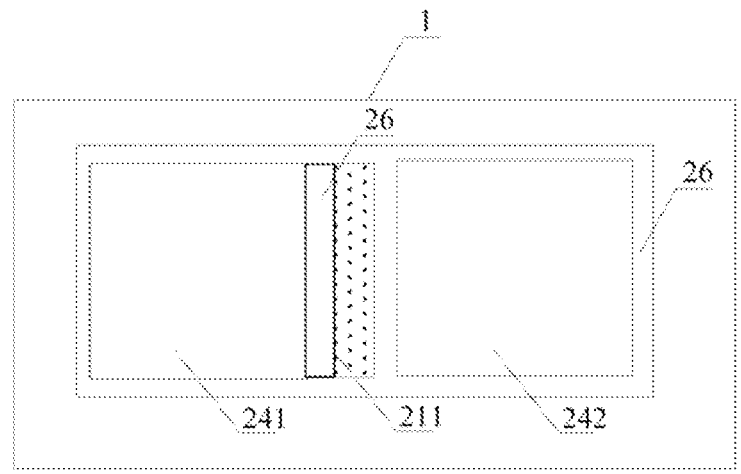
FIG. 10 is an overlooking schematic diagram of the OLED according to embodiment of the present invention, wherein, an insulating layer is formed on the substrate.

5. By thermal evaporation method or ion sputtering method, forming an insulating layer, such as SiNx or SiOx film layer. By masking, exposing, photoengraving sculpture processes, forming an insulating layer 26 on the periphery of the anodes of the first OLED and the second OLED, and an insulating layer 26 on an area with a certain width on one side of the organic luminescent layer 231 on the first anode 211, the width of the insulating layer 26 on the area on one side of the organic luminescent layer 231 of the first anode 211 is smaller than the width of the exposed partial of the first anode 211, which is used to connect with the second cathode 212, the formed insulating layer 26 is shown in FIG. 10.

Figure 11:
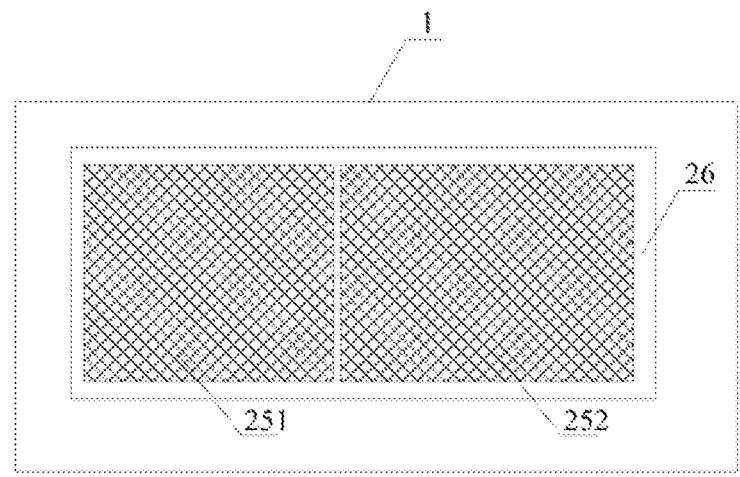
FIG. 11 is an overlooking schematic diagram of the OLED according to embodiment of the present invention, wherein, a cathode is formed on the substrate.

6. Depositing a metal film layer such as silver on the substrate 1 by thermal evaporation method, on which, the insulating layer 26 has been formed. Forming two cathode patterns that have a certain area by masking, exposing, photoengraving sculpture processes, which are the first cathode 251 and the second cathode 252. The overlooking schematic diagram of the substrate 1 with the formed first cathode 251 and second cathode 252 is shown in FIG. 11. The first cathode 251 is used to connect to the voltage source provide $V_{SS}$, the second cathode 252 is used to connect to the exposed partial of the first anode 211, the second cathode 252 can be set as a little larger than the area of the organic luminescent layer, so as to electrically connect to the first anode 211.

In addition to using thermal evaporation method mentioned above, in the embodiment of the present invention, the vacuum evaporation technology (VTE) used in precision metal mask (FFM) can also be used to form the films.

The structure of OLEDs connected in series and the manufacturing process after the OLEDs being connected in series described above in the embodiment of the present invention are illustrated by only two OLEDs being connected in series as an example, in a specific implementation process, it is possible to connect more OLEDs in series according to actual needs, so as to reduce the useless heat power consumption brought by the wiring voltage drop, increase the electrical-optical efficiency of the display apparatus. The embodiment of the present invention illustrated the top emission OLED, which is used only as an example, it is the same for a bottom emission OLED, the manufacturing process is similar, which will not described repeatedly.

Based on the same idea of invention, the embodiment of the present invention also provides a display apparatus, includes the active matrix driving circuit described above. The display apparatus can be a display apparatus such as an organic electroluminescence display OLED panel, an OLED display, an OLED television or an OLED electronic paper, etc.

The organic light emitting display panel provided by the embodiment of the present invention increases the electrical-optical efficiency of the display device by setting light emitting device groups in each pixel structure, wherein, each light emitting device group includes at least two light emitting devices, so as to share voltage by the light emitting devices without setting sharing voltage transistors. For example, the light emitting device group is composed by n light emitting devices. The current section of the OLED can be set as 1/n of the section of the OLED in the existing active matrix driving circuit. The driving current can be reduced to 1/n of the current required by the existing active matrix driving circuit. At this point, the power consumption caused by the reduced wiring voltage drop of the active matrix driving circuit is $1/n^2$ of the power consumption of the existing wiring voltage drop. The useless heat power consumption brought by the wiring voltage drop is largely reduced, and the electrical-optical efficiency of the display apparatus is increased.

Obviously, a person skilled in the art can make various modifications and variations to the invention without departing from the spirit and scope of the present invention. Thus, if these modifications and variations of the present invention fall in the scope of the claims of the present invention and their equivalents, the present invention also intended to include these modifications and variations.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A display panel, wherein a pixel unit structure of the display panel comprises three pixel structures of a red pixel structure, a green pixel structure, and a blue pixel structure, wherein at least one of these three pixel structures comprises an active matrix driving circuit and further comprises at least two light emitting devices connected in series which are connected to the active matrix driving circuit, the light emitting devices compose a light emitting device group, and the active matrix driving circuit drives the light emitting devices to emit light;

wherein the active matrix driving circuit comprises a first end and a second end, the first end is coupled to a first reference voltage source, the second end is coupled to a second reference voltage source, the light emitting devices connected in series are disposed on the first end or the second end of the active matrix driving circuit, or disposed on the first end and the second end of the active matrix driving circuit respectively;

when there are more than one of the light emitting devices disposed on the first end or the second end of the active matrix driving circuit, an anode of one light emitting device is electrically connected to a cathode of an adjacent light emitting device;

when there are more than one of the light emitting devices disposed on the first end or the second end;

the light emitting devices connected in series comprise: a substrate; a first anode and a second anode arranged at the same layer on the substrate; a first organic light emitting layer and a second organic light emitting layer arranged at the same layer on the first anode and the second anode respectively; a first cathode and a second cathode arranged at the same layer on the first organic light emitting layer and the second organic light emitting layer respectively;

a first insulating layer and a second insulating layer are arranged opposite to each other and between the first organic light emitting layer and the second organic light emitting layer, and there exists a gap between the first insulating layer and the second insulating layer;

the first anode and the second cathode extend into the gap, and the second cathode is directly electrically connected to a portion of the first anode extending into the gap;

or the light emitting devices connected in series comprise: the substrate; the first cathode and the second cathode arranged at the same layer on the substrate; the first organic light emitting layer and the second organic light emitting layer arranged at the same layer on the first cathode and the second cathode respectively; the first anode and the second anode arranged at the same layer on the first organic light emitting layer and the second organic light emitting layer respectively;

a first insulating layer and a second insulating layer are arranged opposite to each other and between the first organic light emitting layer and the second organic light emitting layer, and there exists a gap between the first insulating layer and the second insulating layer;

the first cathode and the second anode extend into the gap, and the second anode is directly electrically connected to a portion of the first cathode extending into the gap.

2. The display panel according to claim 1, wherein, the light emitting devices connected in series are red light emitting devices, green light emitting devices or blue light emitting devices; in each pixel unit structure, the number of the red light emitting devices is different from the number of the green light emitting devices and/or the number of the red light emitting devices is different from the number of the blue light emitting devices, and/or the number of the green light emitting devices is different from the number of the blue light emitting devices.

3. The display panel according to claim 2, wherein, the number of the red light emitting devices is larger than the number of the blue light emitting devices, and the number of the green light emitting devices is larger than the number of the blue light emitting devices.

4. The display panel according to claim 3, wherein, in each pixel unit structure, the number of the red light emitting devices is 2-5, the number of the green light emitting devices is 2-6, and the number of the blue light emitting devices is 1-3.

5. The display panel according to claim 1, wherein the light emitting device is an organic light emitting diode.

6. The display panel according to claim 1, wherein light emitting areas of the light emitting devices connected in series are the same.

7. A display apparatus, comprising the display panel according to claim 1.

8. The display apparatus according to claim 7, wherein, the light emitting devices connected in series are red light emitting devices, green light emitting devices or blue light emitting devices; in each pixel unit structure, the number of the red light emitting devices is different from the number of the green light emitting devices and/or the number of the red light emitting devices is different from the number of the blue light emitting devices, and/or the number of the green light emitting devices is different from the number of the blue light emitting devices.

9. The display apparatus according to claim 8, the number of the red light emitting devices is larger than the number of the blue light emitting devices, and the number of the green light emitting devices is larger than the number of the blue light emitting devices.

10. The display apparatus according to claim 9, wherein, in each pixel unit structure, the number of the red light emitting devices is 2-5, the number of the green light emitting devices is 2-6, and the number of the blue light emitting devices is 1-3.

11. The display panel according to claim 1, wherein all the light emitting devices connected in series are red light emitting devices, or all the light emitting devices connected in series are green light emitting devices, or all the light emitting devices connected in series are blue light emitting devices.

* * * * *